(12) United States Patent
Seo et al.

(10) Patent No.: US 7,696,570 B2
(45) Date of Patent: *Apr. 13, 2010

(54) TRANSISTORS OF SEMICONDUCTOR DEVICE HAVING CHANNEL REGION IN A CHANNEL-PORTION HOLE AND METHODS OF FORMING THE SAME

(75) Inventors: Hyeoung-Won Seo, Gyeonggi-do (KR); Du-Heon Song, Gyeongg-do (KR); Sang-Hyun Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/350,708

(22) Filed: Jan. 8, 2009

(65) Prior Publication Data

US 2009/0114999 A1 May 7, 2009

Related U.S. Application Data

(62) Division of application No. 11/073,246, filed on Mar. 4, 2005, now Pat. No. 7,491,603.

(30) Foreign Application Priority Data

Mar. 5, 2004 (KR) ............................. 2004-15204

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ................. 257/330; 257/328; 257/329; 257/331; 257/332; 257/333; 257/334; 257/E29.13; 257/E29.134

(58) Field of Classification Search ......... 257/328–334, 257/E29.13, E29.134
See application file for complete search history.

(56) References Cited

U.S. PATENT DOCUMENTS

| 6,172,391 B1 * | 1/2001 | Goebel et al. ............... 257/305 |
| 6,262,453 B1 * | 7/2001 | Hshieh ....................... 257/341 |
| 6,355,974 B1 | 3/2002 | Lin et al. |
| 6,423,618 B1 | 7/2002 | Lin et al. |

(Continued)

FOREIGN PATENT DOCUMENTS

JP     10-032331     2/1998

(Continued)

*Primary Examiner*—Ida M Soward

(57) ABSTRACT

According to some embodiments of the invention, transistors of a semiconductor device have a channel region in a channel-portion hole. Methods include forming embodiments of the transistor having a channel-portion hole disposed in a semiconductor substrate. A channel-portion trench pad and a channel-portion layer are sequentially formed at a lower portion of the channel-portion hole. A word line insulating layer pattern and a word line pattern are sequentially stacked on the channel-portion layer and fill the channel-portion hole, disposed on the semiconductor substrate. The channel-portion layer is formed to contact the semiconductor substrate through a portion of sidewall of the channel-portion hole, and forms a channel region under the word line pattern. Punch-through is prevented between electrode impurity regions corresponding to source and drain regions.

11 Claims, 16 Drawing Sheets

U.S. PATENT DOCUMENTS

| | | | |
|---|---|---|---|
| 6,674,124 B2 * | 1/2004 | Hshieh et al. | 257/330 |
| 6,737,323 B2 * | 5/2004 | Mo | 438/270 |
| 6,756,633 B2 * | 6/2004 | Wang et al. | 257/317 |
| 6,787,838 B1 | 9/2004 | Chidambarrao et al. | |
| 7,005,701 B2 * | 2/2006 | Hsiao et al. | 257/328 |
| 7,102,182 B2 * | 9/2006 | Takemori et al. | 257/271 |
| 2003/0057483 A1 * | 3/2003 | Bronner et al. | 257/330 |
| 2005/0199930 A1 * | 9/2005 | Seo et al. | 257/296 |

FOREIGN PATENT DOCUMENTS

| | | |
|---|---|---|
| KR | 1998-034616 | 8/1998 |
| KR | 1998-068340 | 10/1998 |
| KR | 1999-0049708 | 7/1999 |

* cited by examiner

TRANSISTORS OF SEMICONDUCTOR DEVICE HAVING CHANNEL REGION IN A CHANNEL-PORTION HOLE AND METHODS OF FORMING THE SAME

CROSS-REFERENCE TO RELATED APPLICATION

This patent application is a divisional of U.S. patent application Ser. No. 11/073,246, filed Mar. 4, 2005, now issued U.S. Pat. No. 7,491,603, which claims priority from Korean Patent Application No. 2004-15204, filed Mar. 5, 2004, the contents of which are hereby incorporated by reference in their entirety.

BACKGROUND OF INVENTION

1. Technical Field

The invention relates to transistors of a semiconductor device and methods of forming the same, and more particularly, to transistors of a semiconductor device having a channel region in a channel-portion hole and methods of forming the same.

2. Discussion of the Related Art

Generally, a transistor includes a word line pattern, source/drain regions and a channel region. The channel region is disposed in the semiconductor substrate under the word line pattern, and the source/drain regions are disposed in the semiconductor substrate so that they overlap the word line pattern. The word line pattern is also disposed on the semiconductor substrate along with the source/drain regions and the channel region. The channel region as well as the word line pattern are reduced in size with reduction of a design rule of a semiconductor device. This reduction tends to create problems, such as a punchthrough between the source and drain regions, as explained below.

To cope with these problems, there has been much research on the semiconductor device to improve characteristics in spite of the reduction of the design rule. One research effort proposes a transistor including a channel-portion hole disposed in the semiconductor substrate, and a word line pattern filling the channel-portion hole. The channel-portion hole has a trench shape. The word line pattern provides a channel region along the semiconductor substrate defining the channel-portion hole. The channel region around the channel-portion hole is longer in length than that of the channel region under the word line pattern on the semiconductor substrate.

However, although the transistor having the channel-portion hole can increase an integration degree of a semiconductor device with the increase of the length of the channel region, a punchthrough between the source region and the drain region associated with the reduction of the design rule is not improved. This is because the reduction of the design rule of the semiconductor device decreases a diameter of the channel-portion hole and concurrently decreases the distance between the source region and the drain region along the channel region around the channel-portion hole. Therefore, the transistor having the channel-portion hole requires a method of improving the punchthrough of the source and the drain regions.

On the other hand, U.S. Pat. No. 6,423,618 to Ming-Jang Lin, et al. (the '618 patent) discloses methods of manufacturing a trench gate structure.

According to the '618 patent, the method includes sequentially forming an epitaxial layer, and a first and a second dielectric layer on a semiconductor substrate. The epitaxial layer has a base region and a source region overlapping the base region. A trench is formed in the epitaxial layer to sequentially penetrate the source and the base regions along with the second and the first dielectric layers.

The method includes forming a third dielectric layer at a lower portion of the trench, and forming a gate oxide layer conformably covering the trench. A polysilicon layer is formed on the second dielectric layer to conformably cover the trench, and a fourth dielectric layer is formed on the polysilicon layer to fill the trench. Subsequently, the fourth dielectric layer and the polysilicon layer are partially removed so that the base region has the same level as the fourth dielectric layer and the polysilicon layer.

However, the method includes performing an etching process on the epitaxial layer to form a transistor having a trench gate structure. The transistor may have an unstable interfacial state along the epitaxial layer defining the trench due to the etching process. The unstable interface of the epitaxial layer becomes a part of a channel region of the transistor, thereby causing a leakage current during the operation of the semiconductor device. Further, the method discloses a method of forming a transistor using different oxide layers on a bottom and a sidewall of the trench as the gate oxide layer, but the oxide layers inside the trench may increase the leakage current and decrease a breakdown voltage of the gate oxide layer due to the different oxide layers during the operation of the transistor.

SUMMARY OF THE INVENTION

According to some embodiments of the invention, there are provided transistors of a semiconductor device and a DRAM cell having channel regions in channel-portion holes suitable for optimizing switching characteristics by forming a channel-portion layer inside a channel-portion hole.

And there are provided methods, according to some embodiments of the invention, of forming transistors of a semiconductor device and a DRAM cell having channel regions in channel-portion holes capable of optimizing the switching characteristics by forming a channel-portion layer inside a channel-portion hole.

BRIEF DESCRIPTION OF THE DRAWINGS

Exemplary embodiments of the invention will be readily apparent to those of ordinary skill in the art upon review of the detailed description that follows when taken in conjunction with the accompanying drawings, in which like reference numerals denote like parts.

DETAILED DESCRIPTION OF THE INVENTION

Figure 1:
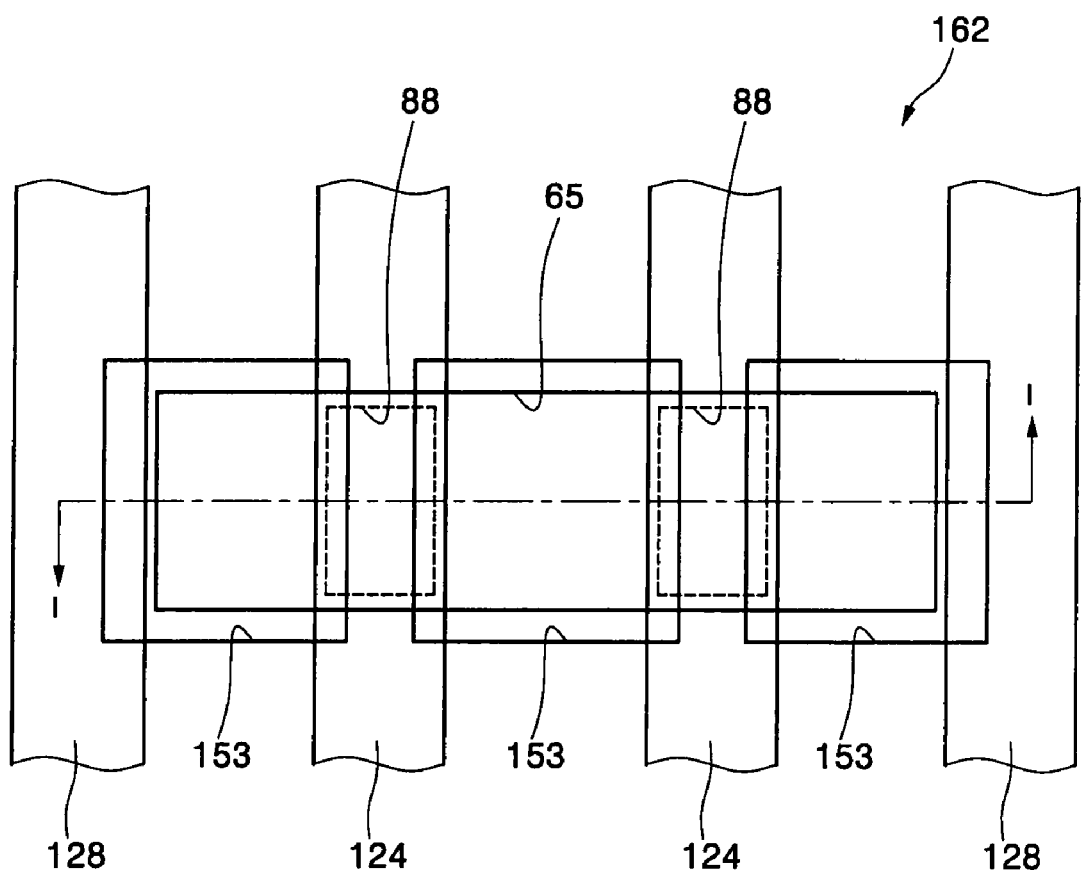
FIG. 1 is a layout of a transistor of a DRAM cell according to exemplary embodiments of the invention.
Figure 2:
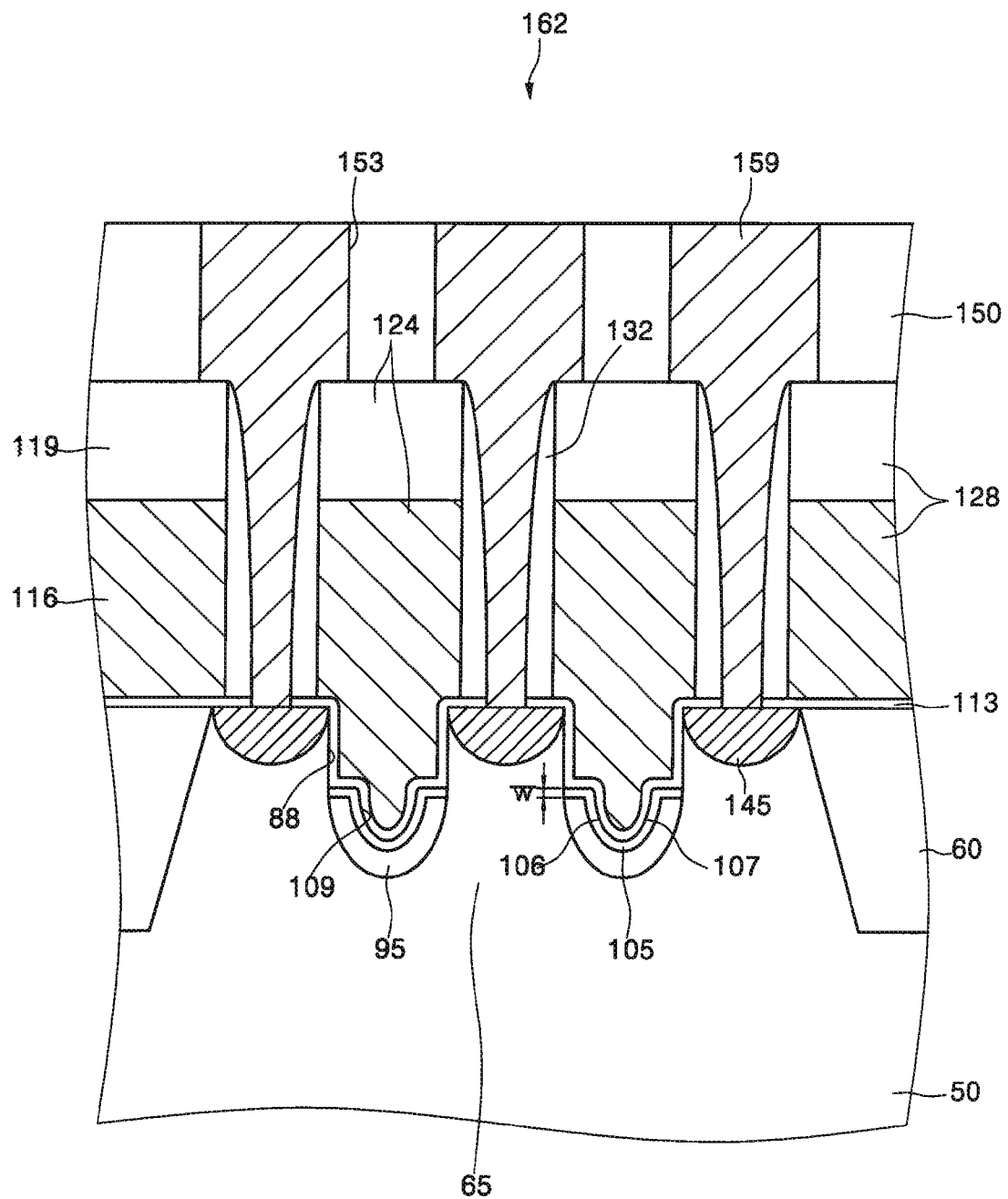
FIG. 2 is a sectional view of a transistor of a DRAM cell taken along line I-I' of FIG. 1.
Figure 3:
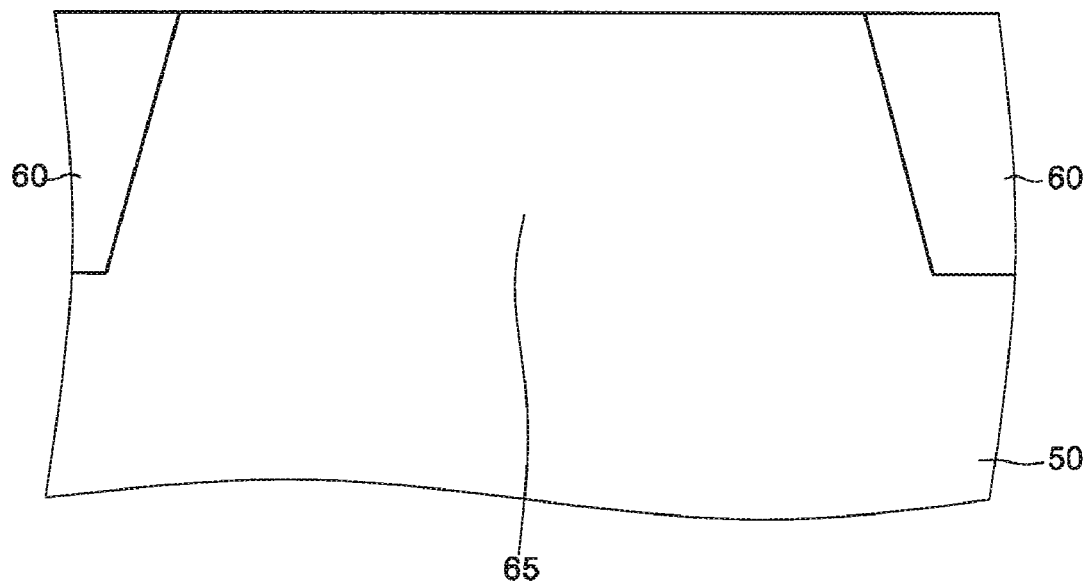
FIGS. 3 through 16 are sectional views illustrating a method of forming a transistor of a DRAM cell taken along a line I-I' of FIG. 1, respectively.
Figure 4:
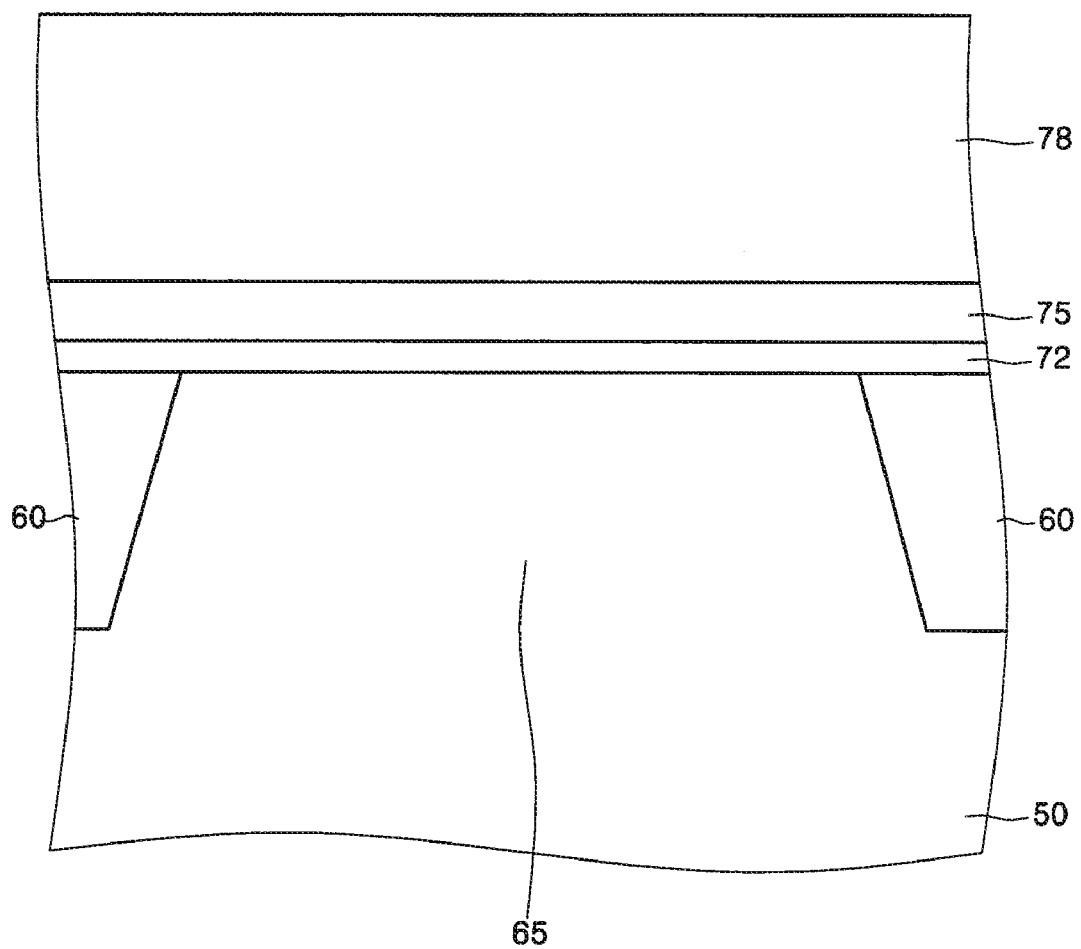
Figure 5:
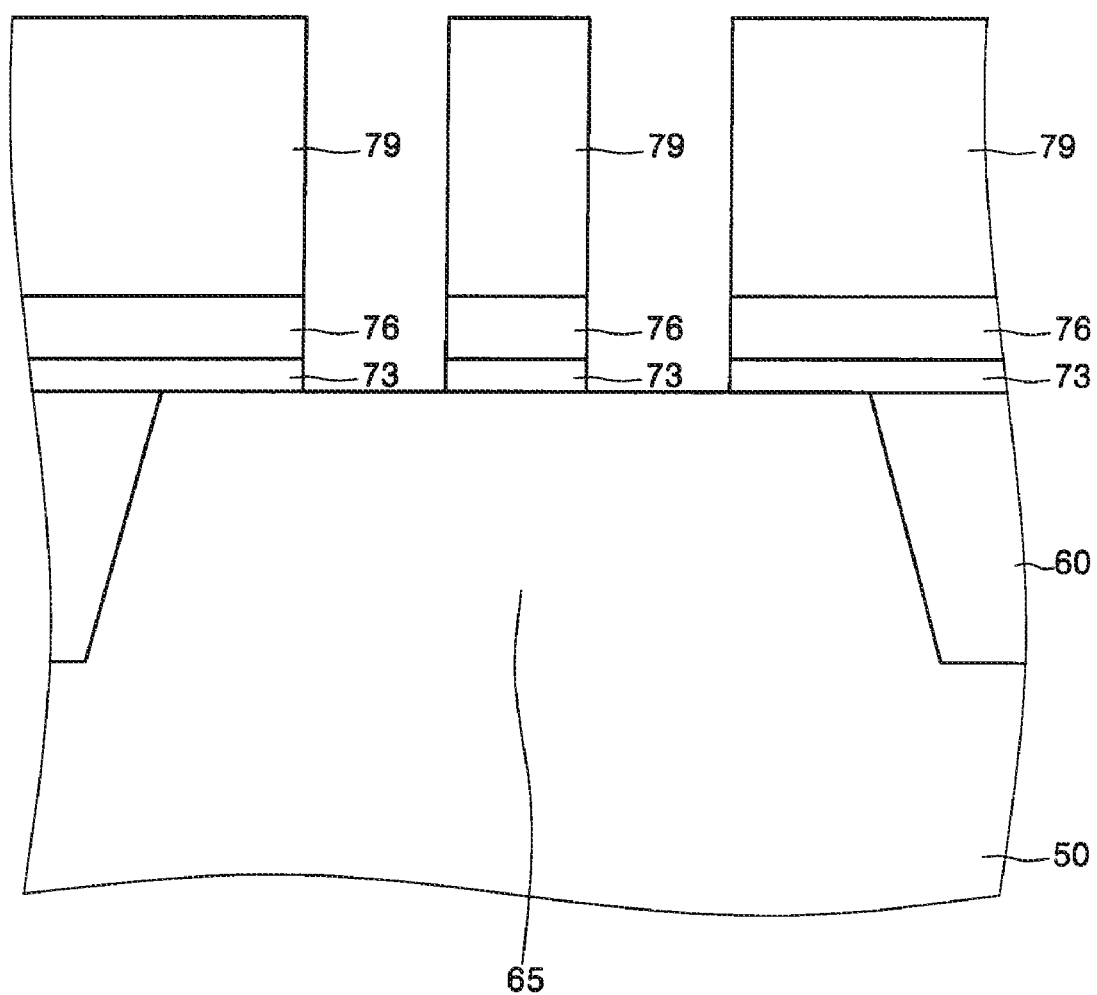
Figure 6:
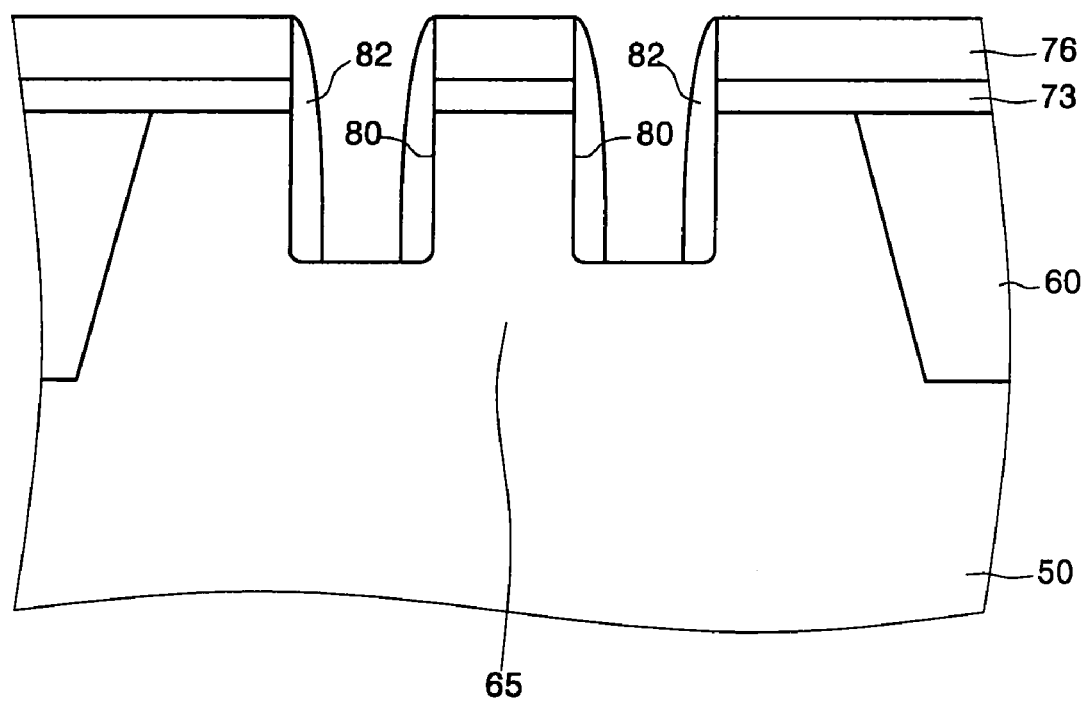
Figure 7:
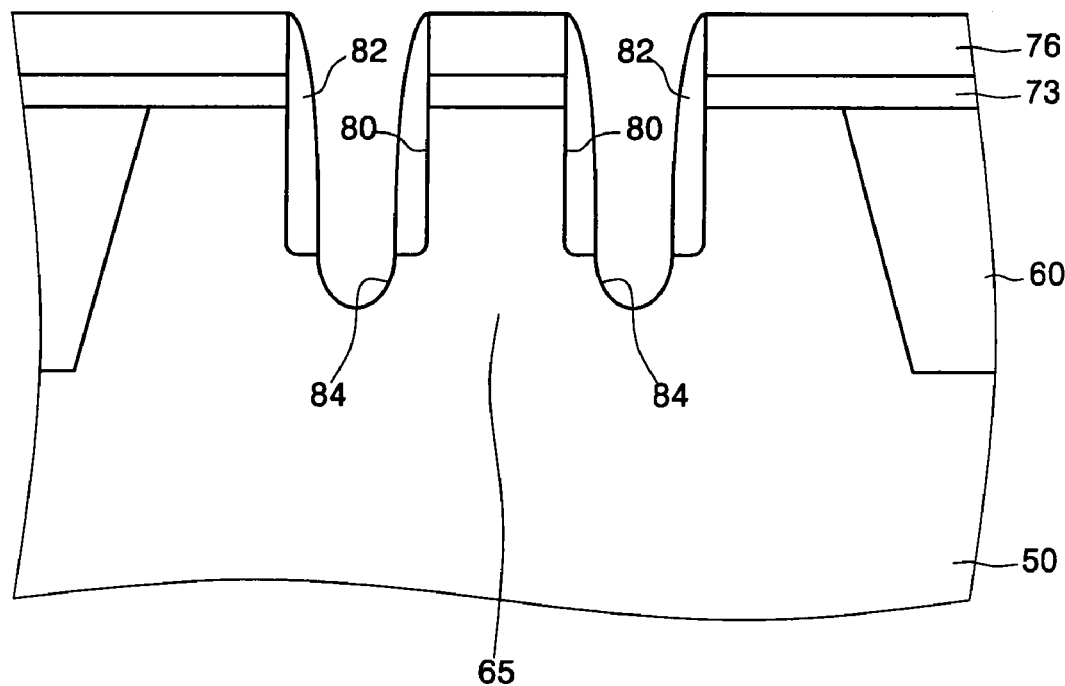
Figure 8:
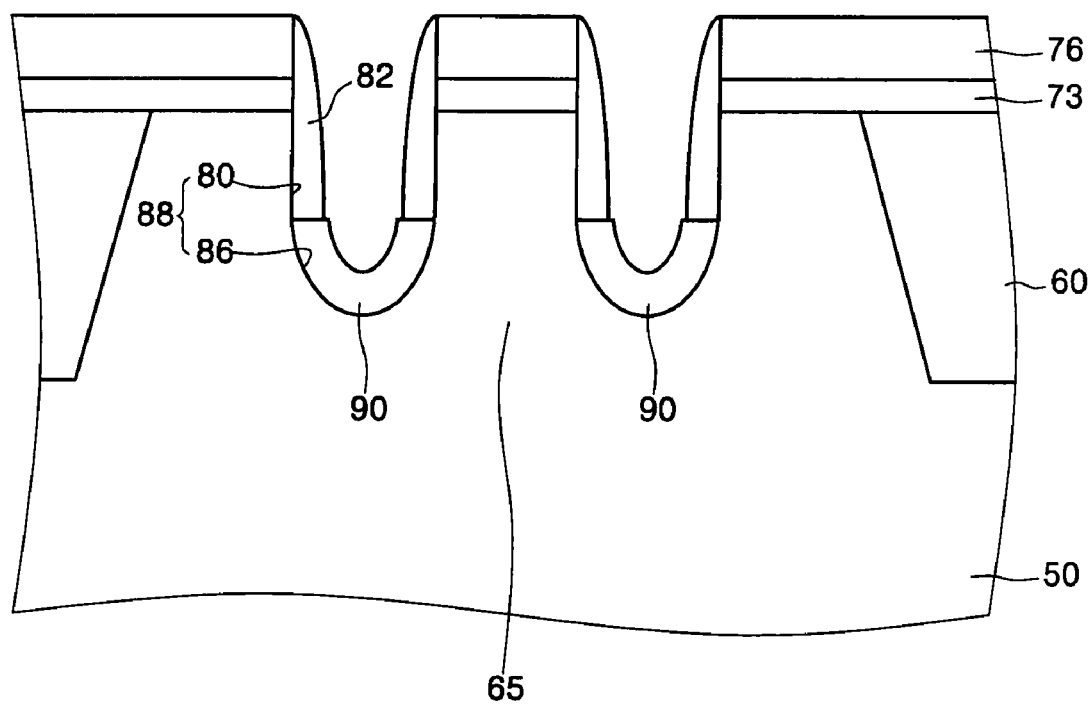

FIG. 1 is a layout of a transistor of a DRAM cell according to exemplary embodiments of the invention, and FIG. 2 is a sectional view of a transistor of a DRAM cell taken along line I-I' of FIG. 1.

Referring to FIGS. 1 and 2, a device isolation layer 60 is disposed in a semiconductor substrate 50 having a DRAM cell array region 162. The device isolation layer 60 defines an active region 65. The semiconductor substrate 50 preferably has a P conductivity type, but the semiconductor substrate 50 may instead have an N conductivity type.

At least two channel-portion holes 88 are disposed extending downward from a main surface of the semiconductor substrate 50 of the active region 65, and the channel-portion holes 88 have a trench shape. Each of the channel-portion holes 88 has a channel-portion trench pad 95 and a channel-portion layer 105 stacked thereon at the lower portion of the channel-portion holes. 88 Word line insulating layer patterns 113 are disposed on the channel-portion layer 105, respectively, and conformably cover each of the channel-portion holes 88, respectively. The channel-portion layer 105 has a groove 109 on a top surface thereof, which is shaped after the lower portion of the channel-portion hole 88. Alternatively, the channel-portion layer 105 may be disposed on the channel-portion trench pad 95 without the groove 109 so that side walls 106, 107 of the channel-portion layer 105 contact each other. The channel-portion layer 105 contacts the semiconductor substrate 50 through the sidewalls of the channel-portion hole 88 with a predetermined width W. The word line insulating layer pattern 113 and the channel-portion trench pad 95 preferably are a silicon oxide ($SiO_2$), and the word line insulating layer pattern 113 may be a silicon oxynitride ($Si_xN_yO_z$). Further, the channel-portion layer 105 is an epitaxial layer, and has a P conductivity type. In a peripheral circuit region except for the DRAM cell array region 162, the channel-portion layer 105 may have a P-type or an N conductivity type. The channel-portion layer 105 may be an undoped epitaxial layer in the DRAM cell array region 162 and the peripheral circuit region. The channel-portion layer 105 preferably has a thickness equal to or greater than that of the word line insulating layer pattern 113. However, in some embodiments the channel-portion layer 105 may be smaller in thickness than that of the word line insulating layer pattern 113.

First word line patterns 124 are disposed on the word line insulating layer pattern 113, in parallel on the active region 65 and spaced apart from each other, and the first word line patterns 124 fill the channel-portion holes 88, respectively. Second word line patterns 128 are disposed on the device isolation layer 60, and adjacent to the active region 65 respectively. Second word line patterns 128 are also disposed in parallel and opposite to at least one of the first word line patterns 124. Each of the first and the second word line patterns 124, 128 includes a word line 116 and a word line capping layer pattern 119 stacked thereon. The word lines 116 of the first word line patterns 124 fill the channel-portion holes 88 on the channel-portion layer 105, respectively. The channel-portion layer 105 forms a channel region of a transistor under the first word line pattern 124. Each of the word lines 116 includes polysilicon having an N conductivity type with or without a metal silicide layer stacked thereon. The polysilicon preferably has a conductivity type different from that of the semiconductor substrate 50. In the peripheral circuit region except for the DRAM cell array region 162, the polysilicon may have the same or different conductivity type as that of the semiconductor substrate 50. The word line capping layer pattern 119 is preferably an insulating layer having an etching ratio different from that of the word line insulating layer pattern 113, for example, a silicon nitride ($Si_3N_4$).

Word line spacers 132 are respectively disposed on sidewalls of each of the first and the second word line patterns 124, 128. Word line insulating layer patterns 113 are preferably disposed under the word line spacers 132 as well as under the first and the second word line patterns 124, 128 respectively. The word line spacers 132 preferably are an insulating layer having the same etching ratio as that of the word line capping layer pattern 119.

Electrode impurity regions 145 are disposed under the main surface of the semiconductor substrate 50 between the first and the second word line patterns 124, 128, and overlap the first and the second word line patterns 124, 128. The electrode impurity regions 145 contact the channel-portion holes 88, respectively. The electrode impurity regions 145 preferably have a conductivity type different from that of the semiconductor substrate 50. The electrode impurity regions 145 refer to a source and a drain region in a transistor, respectively.

Plug contact holes 153 are disposed between the first and the second word line patterns 124, 128, extend from upper surfaces of the first and the second word line patterns 124, 128, and are isolated by an interlayer insulating layer 150. The plug contact holes 153 expose the main surface of the semiconductor substrate 50. The interlayer insulating layer 150 preferably is an insulating layer having a etching ratio different from that of the word line spacer 132.

The plug contact holes 153 are filled with plug patterns 159, respectively. Upper portions of the plug patterns 159 are surrounded by the interlayer insulating layer 150, respectively, whereas the lower portions of the plug patterns 159 are spaced apart by the first word line patterns 124 so that they are electrically insulated from each other. Further, the plug patterns 159 contact the electrode impurity regions 145, respectively. The plug patterns 159 preferably have the same conductivity type as that of the electrode impurity regions 145. Each of the plug patterns 159 between the channel-portion holes 88 is a bit-line node, and the remaining plug patterns 159 are capacitor nodes.

As a result, the invention provides the transistor including the plug patterns 159, the electrode impurity regions 145, the channel-portion layers 105, and the first and the second word line patterns 124, 128. That is, the first and the second word line patterns 124, 128 are gates of the transistor, respectively, and the channel-portion layers 105 are channel regions of the transistor, respectively. Further, the electrode impurity regions 145 are source and drain regions of the transistor, respectively, and the plug patterns 159 are electrical nodes of the source and the drain regions of the transistor, respectively.

Hereinafter, methods of forming transistors according to embodiments of the invention will be described in reference to attached drawings.

FIGS. 3 through 16 are sectional views illustrating a method, according to an embodiment of the invention, of forming a transistor of a DRAM cell taken along line I-I' of FIG. 1, respectively.

Referring to FIG. 1 and FIGS. 3 through 6, a device isolation layer 60 is formed in the semiconductor substrate 50 of a DRAM cell array region 162 to isolate an active region 65. The semiconductor substrate 50 preferably is formed to have a P conductivity type, but may be formed to have an N conductivity type.

A pad layer 72, a reflective layer 75, and a photoresist layer 78 are sequentially formed on the semiconductor substrate having the device isolation layer 60. The reflective layer 75 may not be formed on the semiconductor substrate 50 if fine photoresist patterns are formed by a photolithography process. The pad layer 72 is preferably formed of an insulating layer having an etching ratio different from that of the device isolation layer 60, for example, a silicon nitride ($Si_3N_4$).

A photolithography process is performed in the photoresist layer 78 to form photoresist patterns 79 on the reflective layer 75. By using the photoresist patterns 79 as an etching mask, an etching process is performed in the reflective layer 75 and the pad layer 72 to expose the main surface of the semiconductor substrate 50 of the active region 65. The etching process forms pad layer patterns 73 and the reflective layer patterns 76 stacked thereon.

By using the reflective layer patterns 76 and the pad layer patterns 73 as an etching mask, an etching process is performed in the semiconductor substrate 50 to form at least two channel trenches 80, and to form channel trench spacer layers 82 on the sidewalls of the reflective layer patterns 76, the pad layer patterns 73 and the channel trenches 80. The channel trench spacer layers 82 expose the bottoms of the channel trenches 80, respectively. The channel trench spacer layers 82 are preferably formed of an insulating layer having the same etching ratio as that of the pad layer 72.

Referring to FIG. 1 and FIGS. 7 through 10, by using the pad layer patterns 73 as well as the channel trench spacer layers 82 and the reflective layer patterns 76 as etching masks, an etching process is performed in the semiconductor substrate 50 to form channel-portion trenches 84. The channel-portion trenches 84 are formed to extend downward from lower portions of the channel trenches 80, respectively. By using the channel trench spacer layers 82 and the pad layer patterns 73 as an oxidation barrier layer, an oxidation process is performed on the channel-portion trenches 84 to form channel-portion trench pad layers 90, respectively. As such, a channel-portion hole 88 is formed by a curved surface, which corresponds to the interfaces 80, 86 between the semiconductor substrate 50, the channel trench spacer layer 82 and the channel-portion trench pad layer 90. The channel-portion trench pad layers 90 are preferably formed of silicon oxide ($SiO_2$).

Subsequently, an etching process is performed in the channel-portion trench pad layers 90 and the channel trench spacer layers 82 to form channel trench spacers 83 and channel-portion trench pads 95 on upper portions and the lower portions of the channel-portion holes 88, respectively. The channel-portion trench pads 95 and the channel trench spacers 83 are formed to expose the semiconductor substrate 50 as much as a predetermined width W along sidewalls of the channel-portion holes 88. The etching process is preferably performed by using an etchant capable of partially, and concurrently etching the channel trench spacer layers 82 and the channel-portion trench pad layers 90. Alternatively, the etching process may be performed using etchants capable of partially and sequentially etching the channel trench spacer layers 82 and the channel-portion trench pad layers 90. Although the etching process is preferably performed by using a wet etch technique, the etching process may be performed by using a dry etch technique.

Figure 9:
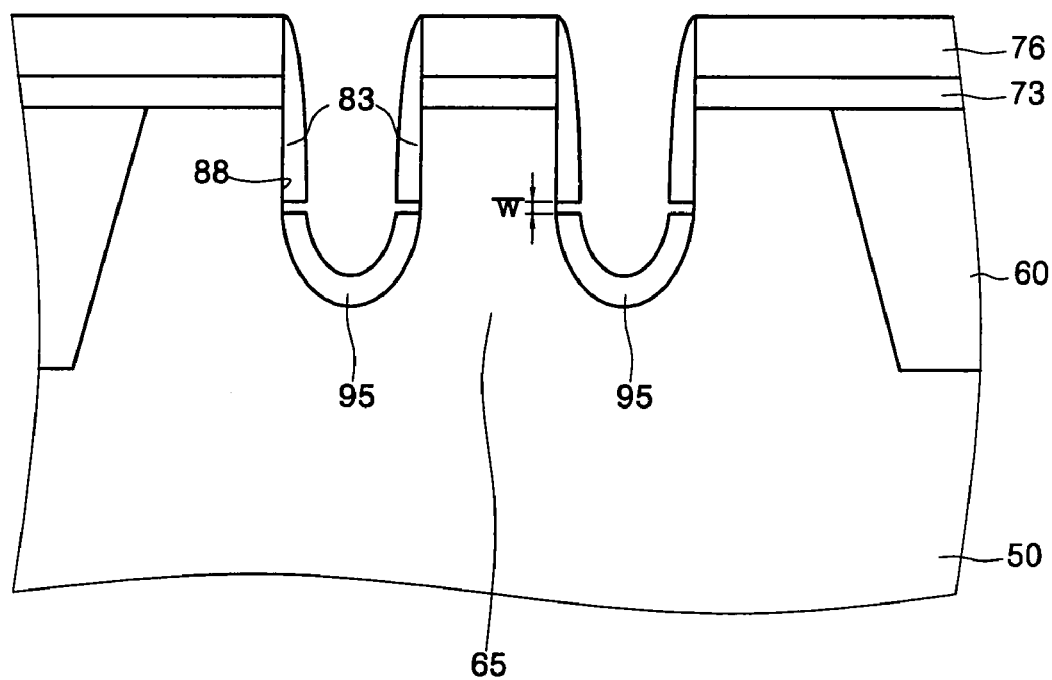
Figure 10:
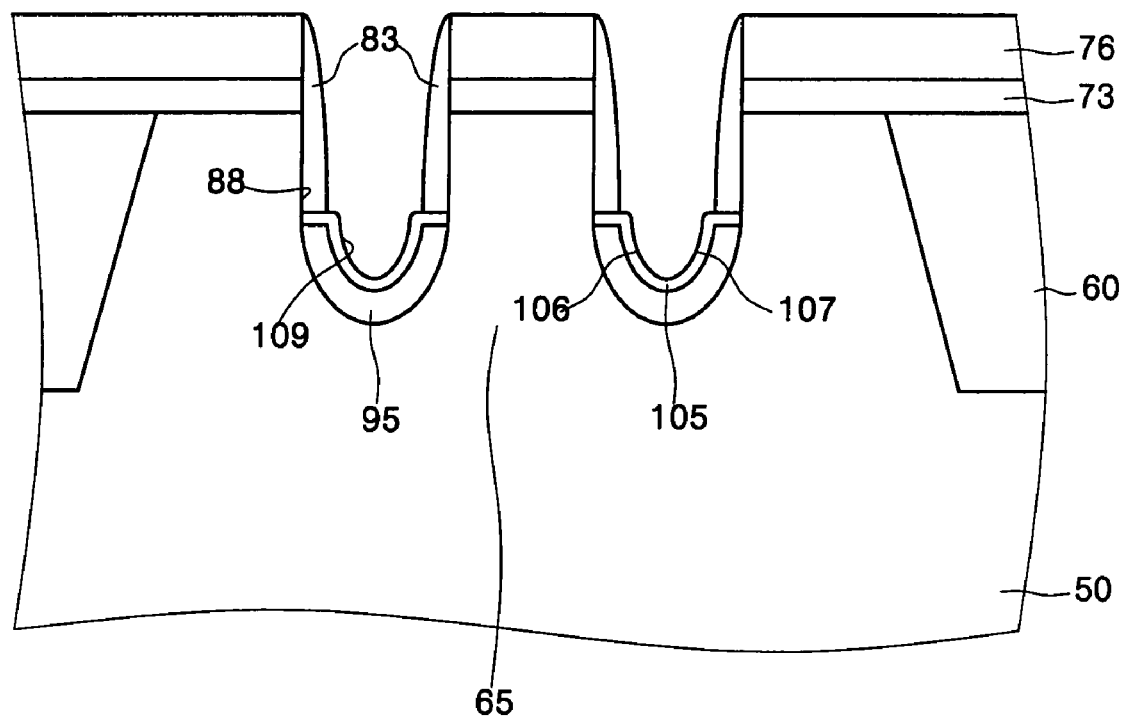
Figure 11:
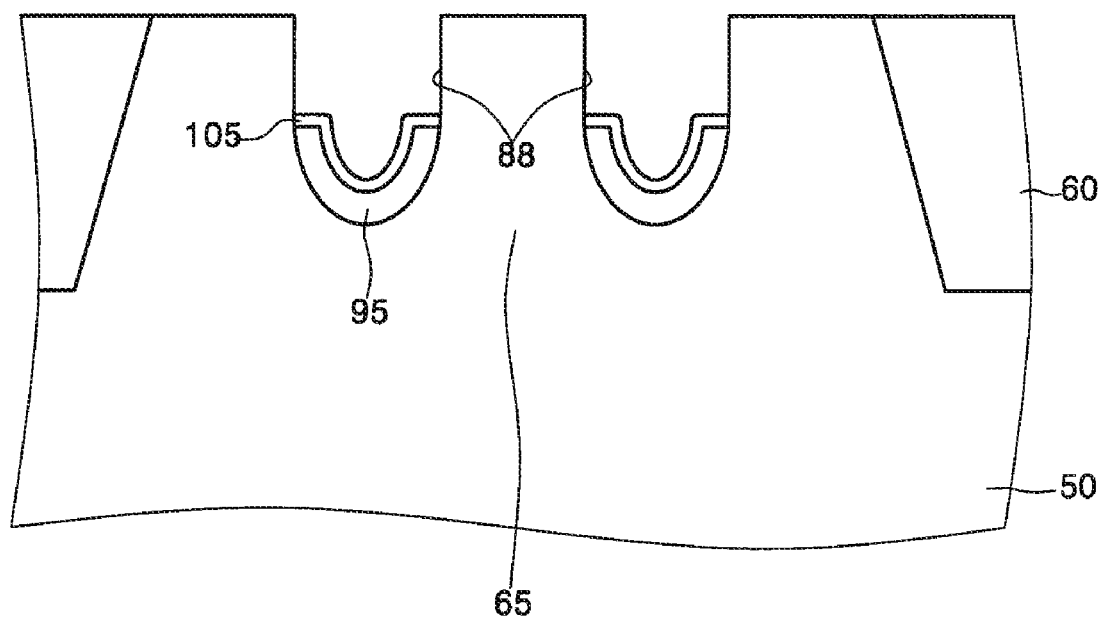
Figure 12:
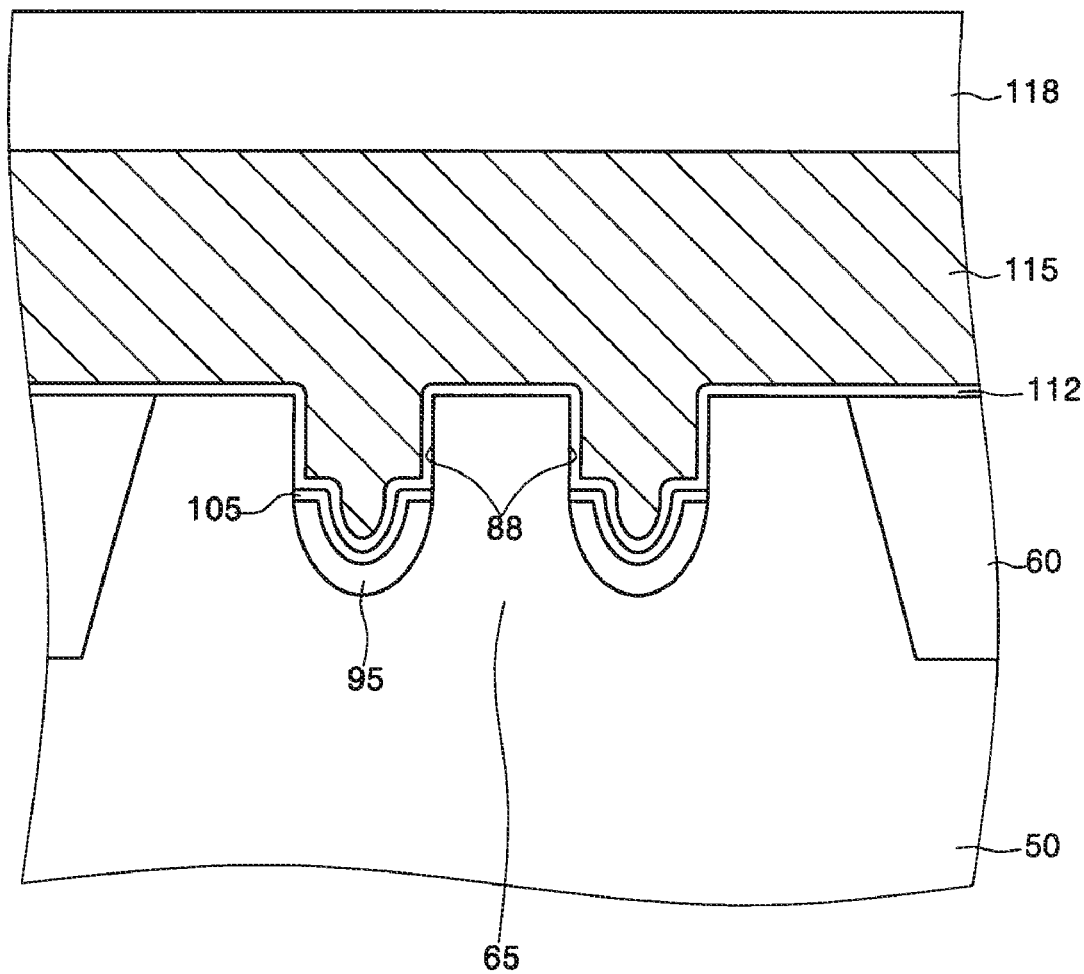
Figure 13:
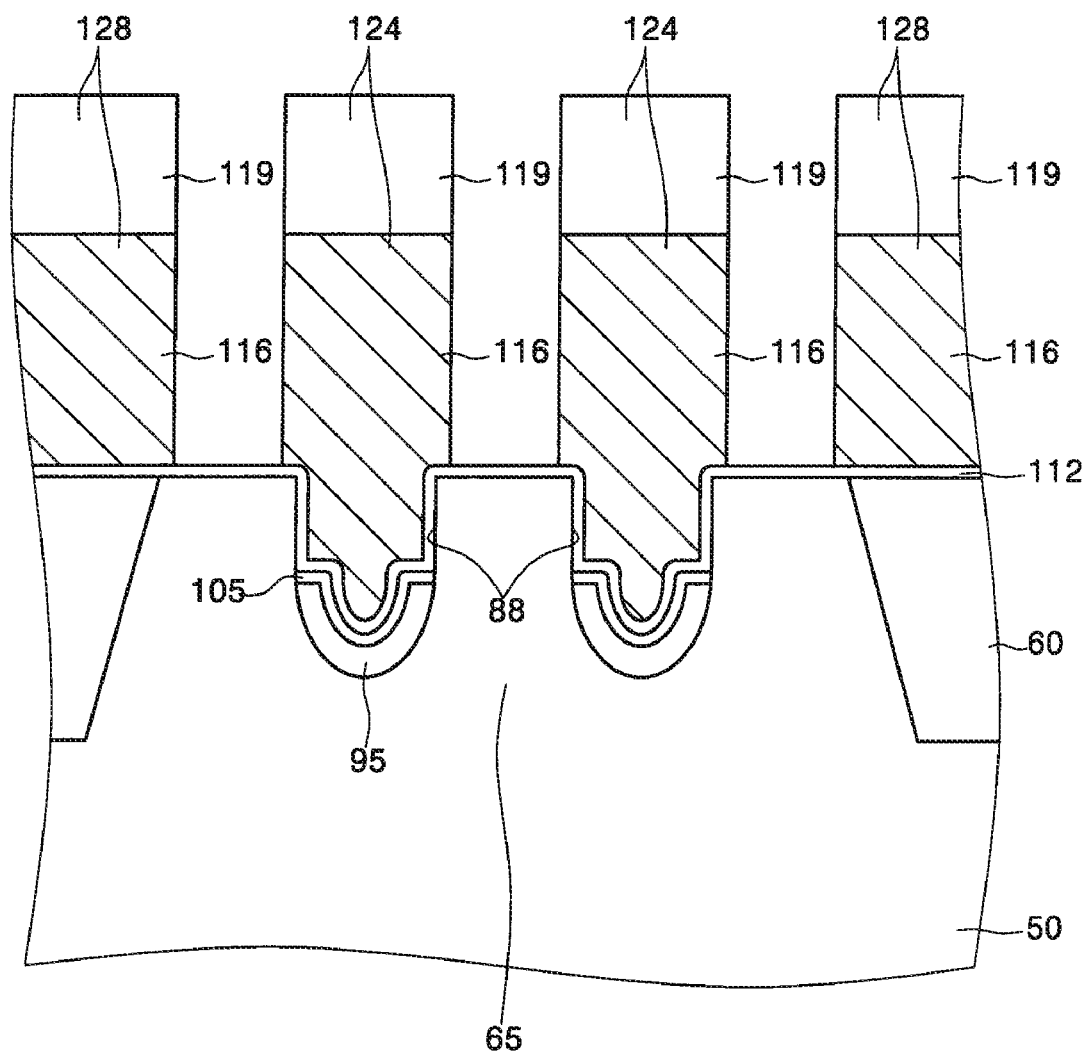
Figure 14:
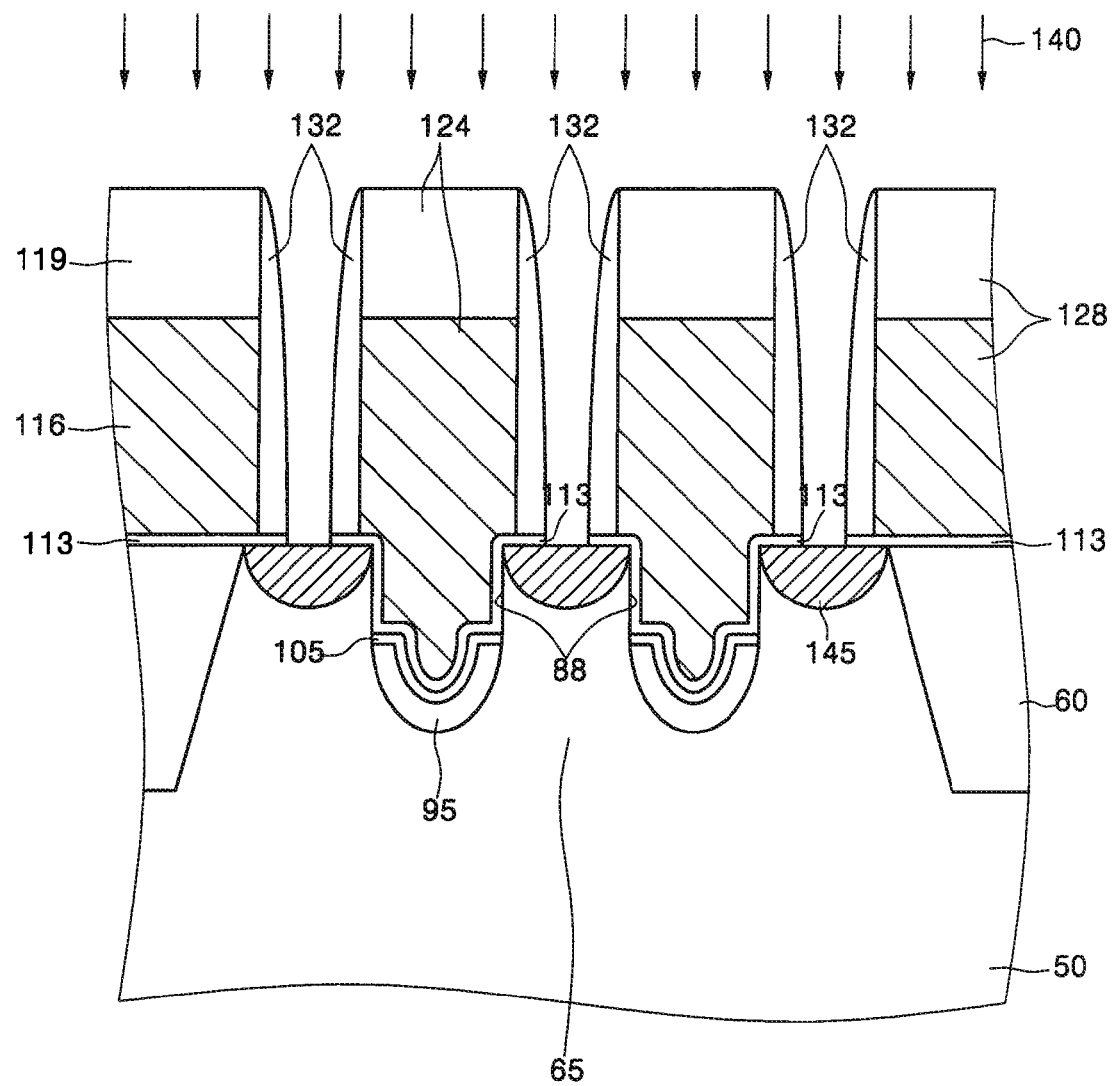

By using the channel trench spacers 83 and the channel-portion trench pads 95 as a growth barrier layer, an epitaxial process is performed on the semiconductor substrate 50 exposed between the channel trench spacers 83 and the channel-portion trench pads 95 to form channel-portion layers 105 in the channel-portion holes 88. The channel-portion layers 105 are formed on the channel-portion trench pads 95, respectively, and are formed to conformably cover the lower portion of the channel-portion holes 88 with a thickness as much as the predetermined width W as shown in FIG. 9. Each of the channel-portion layers 105 are formed to have a groove 109 on a top surface thereof, which is shaped after the lower portion of the channel-portion hole 88. The groove 109 of the channel-portion layer 105 may be removed if side walls 106, 107 of the channel-portion layers 105, facing to each other, are in contact with each other. The channel-portion layers 105 are formed of an epitaxial layer having a P conductivity type. In the peripheral circuit region except the DRAM cell array region 162, the channel-portion layers 105 may be formed of an epitaxial layer having a P or an N conductivity type. The channel-portion layers 105 may be formed of an undoped epitaxial layer regardless of the DRAM cell array region 162 and the peripheral circuit region.

Referring to FIG. 1 and FIGS. 11 through 14, by using the channel-portion layer 105 as an etching stop layer, the channel trench spacers 83 along with the reflective layer patterns 76 and the pad layer patterns 73 are removed from the semiconductor substrate 50. Thus, each of the channel-portion holes 88 are formed to have the channel-portion trench pad 95 and the channel-portion layer 105 stacked thereon. Each of the channel-portion layer 105 forms a channel region of a transistor.

Then, a word line insulating layer 112, a word line layer 115, and a word line capping layer 118 are sequentially formed on the semiconductor substrate having the channel-portion layer 105. The word line capping layer 118 is formed of an insulating layer having the same etching ratio as that of the channel trench spacers 83 of FIG. 10. The word line layer 115 is formed of polysilicon having an N conductivity type with or without a metal silicide layer stacked thereon. The word line layer 115 in the peripheral circuit region except the DRAM cell array region 162 may be formed of polysilicon having an N type or a P conductivity type. The word line insulating layer 112 is formed on the channel-portion layer 105 to conformably cover the channel-portion holes 88. The word line insulating layer 112 is preferably formed of an insulating layer having the same etching ratio as that of the channel-portion trench pad layer 90 of FIG. 8, or a silicon oxynitride ($Si_xO_yN_z$). The channel-portion layer 105 is preferably formed with a thickness the same or greater than that of the word line insulating layer 112. Alternatively, the channel-portion layer 105 may be formed with a thickness smaller than that of the word line insulating layer 112.

By using the word line insulating layer 112 as an etching stop layer, photolithography and etching processes are sequentially performed in the word line capping layer 118 and the word line layer 115. By the photolithography and etching processes, first and second word line patterns 124, 128 are formed on the word line insulating layer 112. Each of the first and the second word line patterns 124, 128 is formed of a word line 116 and a word line capping layer pattern 119 stacked thereon. The first word line patterns 124 are formed on the active region 65 and spaced apart from each other, so that the word lines 116 of the first patterns 124 fill the channel-portion holes 88, respectively. The second word line patterns 128 are formed on the device isolation layer 60 to be in parallel and opposite to at least one of the first word line patterns 124. The first and the second word line patterns 124, 128 function as the gates of the transistor, respectively.

Word line spacers 132 are formed on sidewalls of the first and the second word line patterns 124, 128 respectively. The word line spacers 132 are formed to expose the semiconductor substrate 50 between them, and word line insulating layer patterns 113 are formed under the word line spacers 132 as well as under the first and the second word line patterns 124, 128, respectively. The word line spacers 132 are preferably formed of an insulating layer having the same etching ratio as that of the word line capping layer pattern 119.

By using the word line spacers 132 along with the first and the second word line patterns 124, 128 as a mask, an ion implantation process 140 is performed in the semiconductor substrate 50 to form electrode impurity regions 145. The electrode impurity regions 145 are formed to overlap the first and the second word line patterns 124, 128, respectively. Further, the electrode impurity regions 145 are preferably formed to have a conductivity type different from that of the semiconductor substrate 50. The electrode impurity regions 145 define source and drain regions of the transistor, respectively.

Figure 15:
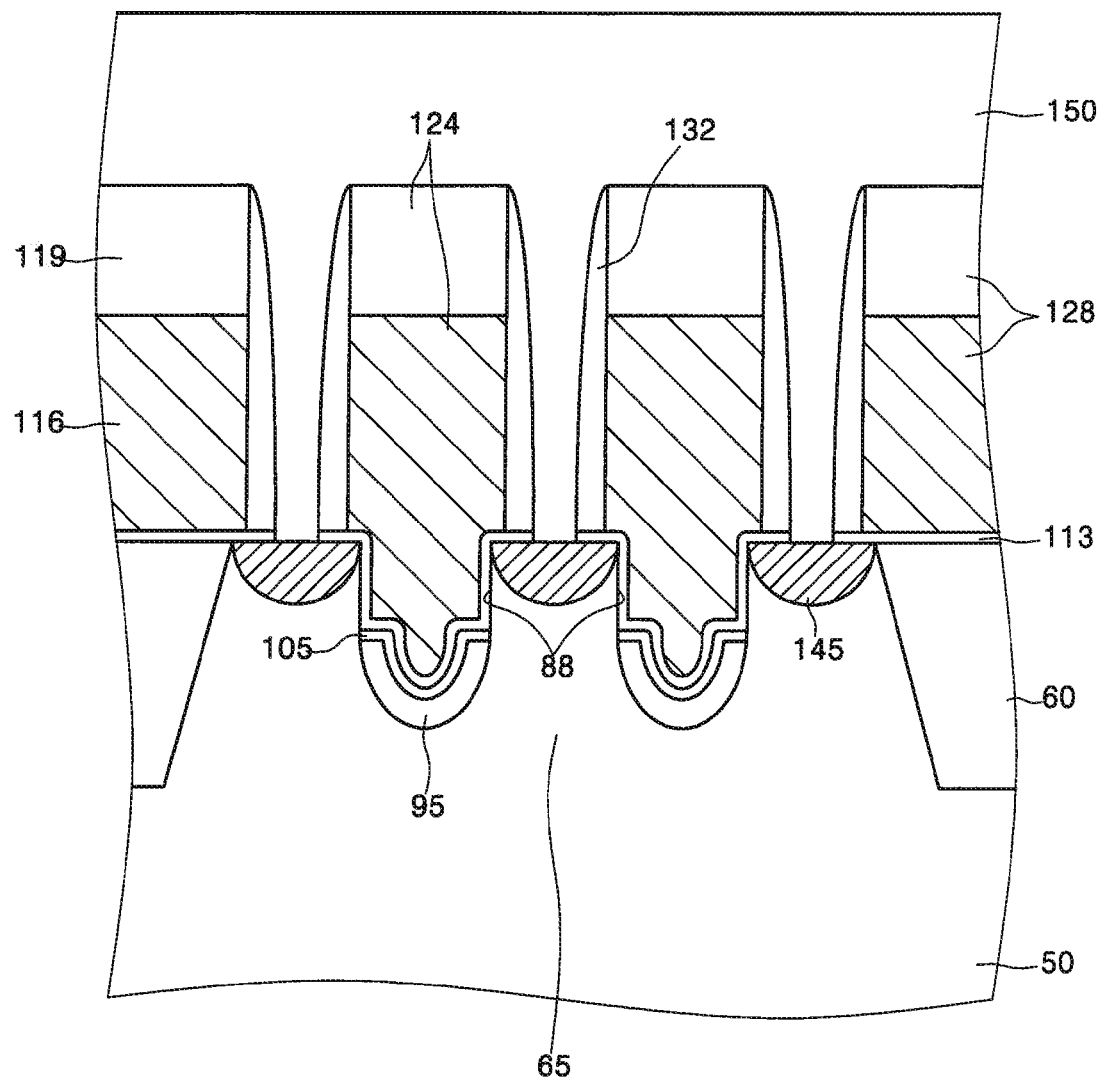
Figure 16:
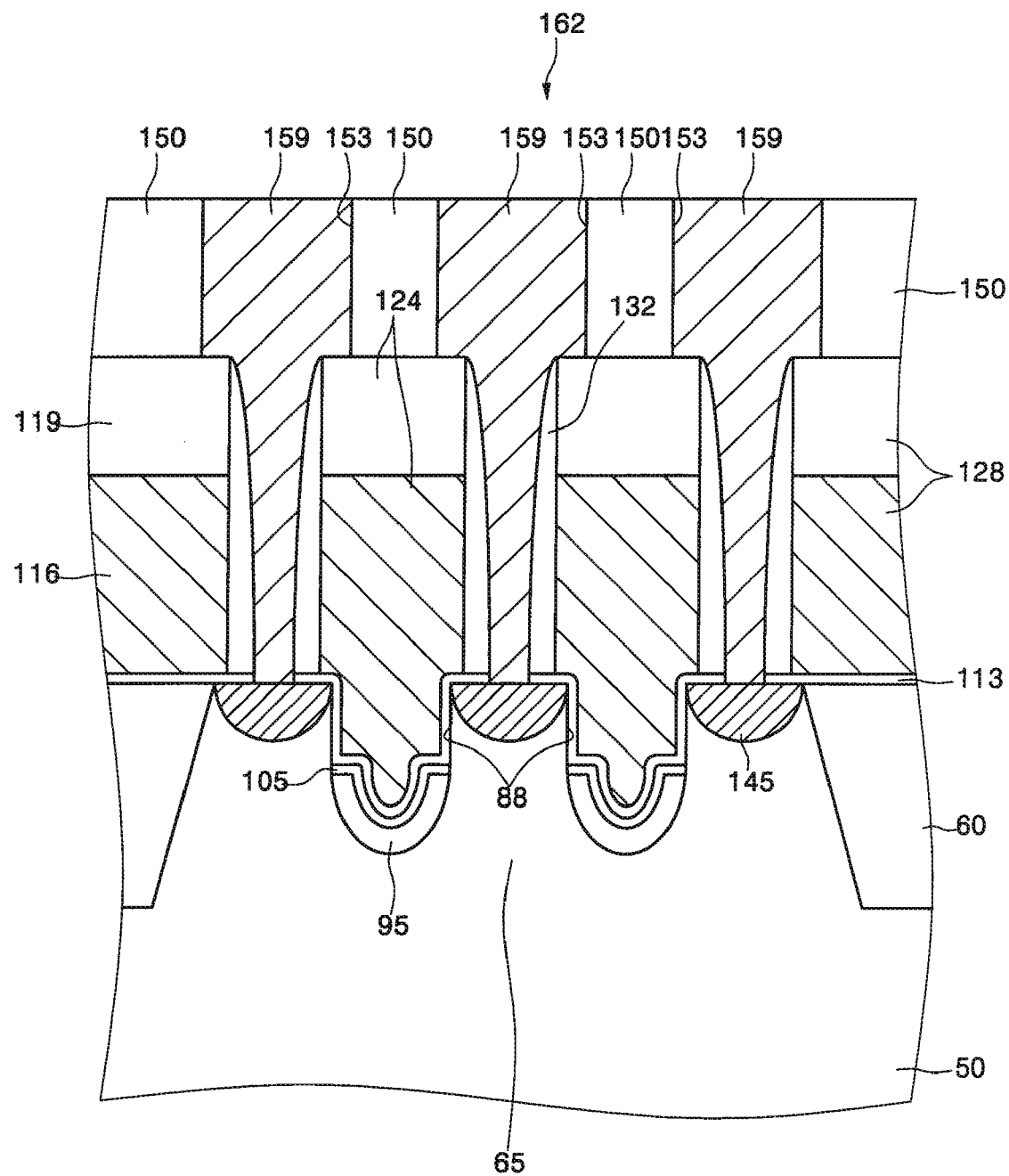

Referring to FIG. 1 and FIGS. 15 and 16, An interlayer insulating layer 150 is formed on the semiconductor substrate 50 having the electrode impurity regions 145. The interlayer insulating layer 150 is formed to sufficiently cover the first and the second word line patterns 124, 128. The interlayer insulating layer 150 is formed of an insulating layer having an etching ratio different from that of the word line spacers 132.

By using the word line capping layer patterns 119 and the word line spacers 132 as an etching stop layer, an etching process is performed in the interlayer insulating layer 150 to form plug contact holes 153. The plug contact holes 153 are formed between the first and the second word line patterns 124, 128 to penetrate the interlayer insulating layer 150. Upper portions of the plug contact holes 153 preferably have a diameter greater than that of lower portions thereof.

The plug contact holes 153 are filled with plug patterns 159, respectively, and the plug patterns 159 are formed to have the same conductivity type as that of the electrode impurity regions 145. The plug patterns 159 contact the electrode impurity regions 145, respectively.

The plug patterns 159 may be classified into capacitor and bit-line nodes, and the capacitor and the bit-line nodes are described as follows. The bit-line nodes are the plug patterns 159 between the first word line patterns 124, and the capacitor nodes are the remaining plug patterns 159 between the first and the second word line patterns 124, 128. The plug patterns 159 form the electrical nodes of the source and the drain regions, respectively.

As a result, the DRAM of the invention drives the transistor by using the sidewall of the channel-portion holes 88 and the channel-portion layer 105 as a channel region, which provides an advantage of preventing a punchthrough between the electrode impurity regions 145 more securely than the case of using the channel region formed along the semiconductor substrate 50 isolating the channel-portion holes 88. This is because it is difficult to inverse the semiconductor substrate 50 around the channel-portion holes 88 due to the voltage drop caused by the channel-portion layer 105 and the channel-portion trench pad 95 during the operation of the transistor.

Further, the DRAM can decrease the number of times an ion implantation process occurs into the semiconductor substrate 50 of the active region 65 since the punchthrough between the electrode impurity regions 145 can be physically prevented by using the channel-portion holes 88 and the channel-portion layer 105. The ion implantation processes are performed to electrically prevent the punchthrough between the electrode impurity regions 145 by using impurity ions. The decrease of the number of times of the ion implantation processes can reduce the concentration of impurity ions in the semiconductor substrate 50 around the channel-portion holes 88. Therefore, a built-in potential can be reduced at the junction between the semiconductor substrate 50 and the electrode impurity regions 145, thereby improving the refresh characteristics of the DRAM cell array region 162.

As described above, the invention provides a method of surely preventing the punchthrough between source and drain regions of a transistor by forming a channel-portion layer inside a channel-portion hole. Therefore, according to embodiments of the semiconductor device and the DRAM cell having the channel-portion layer, the refresh characteristics can be optimized.

Embodiments of the invention will now be described in a non-limiting way.

Embodiments of the invention provide transistors of a semiconductor device and a DRAM cell having a channel region in a channel-portion hole and methods of forming the same.

According to some embodiments of the invention, there are provided transistors of a semiconductor device having a channel region in a channel-portion hole that includes a channel-portion hole disposed in a semiconductor substrate. A channel-portion trench pad and a channel-portion layer are sequentially disposed at a lower portion of the channel-portion hole. A word line insulating layer pattern and a word line pattern are sequentially stacked on the channel-portion layer and fill the channel-portion hole, disposed on the semiconductor substrate. The channel-portion layer contacts the semiconductor substrate through a portion of sidewall of the channel-portion hole, and forms a channel region under the word line pattern.

According to some embodiments of the invention, there are provided transistors of a DRAM cell having a channel region in a channel-portion hole that includes an active region isolated by a device isolation layer. At least two channel-portion holes extend downward from a main surface of a semiconductor substrate of the active region. A channel-portion trench pad and a channel-portion layer are sequentially stacked at a lower portion of each of the channel-portion holes. A word line insulating layer pattern is disposed on the channel-portion layer and conformably covers each of the channel-portion holes. First word line patterns are disposed on the word line insulating layer pattern and in parallel on the active region. First word line patterns are spaced apart from each other and respectively fill the channel-portion holes. Second word line patterns are disposed on the device isolation layer adjacent to the active region, respectively. Second word line patterns are disposed in parallel and opposite to at least one of the first word line patterns. The channel-portion layer contacts the semiconductor substrate through a sidewall of each of the channel-portion holes, and forms a channel region under the first word line pattern.

According to some embodiments of the invention, there are provided methods of forming transistors of a semiconductor device having a channel region in a channel-portion hole that includes forming pad layer patterns exposing a semiconductor substrate. A channel-portion hole is formed between the pad layer patterns to extend downward from a main surface of the semiconductor substrate. A lower portion and an upper portion of a sidewall of the channel-portion hole are covered with a channel-portion trench pad layer and a channel trench spacer layer, respectively. An etching process is performed on the channel trench spacer layer and the channel-portion trench pad layer to form a channel-portion trench pad and a channel trench spacer, respectively, on the lower portion and the upper portion of the sidewall of the channel-portion hole. The etching process is performed to expose the semiconductor substrate with a predetermined width along the sidewall of the channel-portion hole between the channel trench spacer and the channel-portion trench pad. An epitaxial process is performed on the semiconductor substrate having the channel trench spacer and the channel-portion trench pad to form a channel-portion layer. The channel-portion layer is formed on the channel-portion trench pad to fill the lower portion of the channel-portion hole with a thickness as much as the predetermined width of the exposed semiconductor substrate. The pad layer pattern and the channel trench spacer are removed from the semiconductor substrate by using the channel-portion layer as an etching stop layer. A word line insulating layer pattern and a word line pattern are sequentially formed on the channel-portion layer and the main surface of the semiconductor substrate to fill the channel-portion hole.

According to some embodiments of the invention, there are provided methods of forming transistors of a DRAM cell having a channel region in a channel-portion hole that includes forming an active region isolated by a device isolation layer. Pad layer patterns are formed to expose a semiconductor substrate of the active region. At least two channel-portion holes are formed between the pad layer patterns to extend downward from a main surface of the semiconductor substrate. A lower portion and an upper portion of a sidewall of each of the channel-portion holes are covered with a channel-portion trench pad layer and a channel trench spacer layer, respectively. An etching process is performed on the channel trench spacer layer and the channel-portion trench pad layer to form a channel-portion trench pad and a channel trench spacer respectively on the lower portion and the upper portion of sidewalls of each of the channel-portion holes. The etching process is performed to expose the semiconductor substrate with a predetermined width along the sidewall of each of the channel-portion holes between the channel trench spacer and the channel-portion trench pad. An epitaxial process is performed on the semiconductor substrate having the channel trench spacer and the channel-portion trench pad to form a channel-portion layer. The channel-portion layer is formed on the channel-portion trench pad to fill the lower portions of each of the channel-portion holes with a thickness as much as the predetermined width of the exposed semiconductor substrate. The pad layer pattern and the channel trench spacer are removed from the semiconductor substrate using the channel-portion layer as an etching stop layer. A word line insulating layer pattern and first and second word line patterns are formed on the active region and the device isolation layer, respectively. The second word line patterns are formed opposite to at least one of the first word line patterns. And the first word line patterns are formed on the channel-portion layers to fill the channel-portion holes, respectively. At this time, the first word line patterns are formed in parallel on the main surface of the semiconductor substrate of the active region and spaced apart from each other.

Although the invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed is:

1. A semiconductor device comprising:
   a channel-portion hole disposed in a semiconductor substrate;
   a channel-portion trench pad and a channel-portion layer sequentially disposed at a lower portion of the channel-portion hole; and
   a word line insulating layer pattern and a word line pattern sequentially stacked on the channel-portion layer in the channel-portion hole, wherein the channel-portion layer is coupled to the semiconductor substrate and forms a channel region under the word line pattern.

2. The device according to claim 1, wherein the channel-portion layer is an epitaxial layer.

3. The device according to claim 1, wherein the word line insulating layer pattern and the channel-portion trench pad comprise silicon oxide.

4. The device according to claim 1, wherein the word line insulating layer pattern comprises silicon oxynitride.

5. The device according to claim 1, further comprising:
   word line spacers disposed respectively on sidewalls of the word line pattern;
   plug contact holes disposed at both sides of the word line pattern, respectively, and extending from an upper surface of the word line pattern and isolated by an interlayer insulating layer; and
   plug patterns respectively filling the plug contact holes, in which
   the word line pattern includes a word line and a word line capping layer pattern stacked thereon, and the word line is disposed over the channel-portion layer and fills the channel-portion hole.

6. The device according to claim 5, wherein the interlayer insulating layer is an insulating layer having an etching ratio different from that of the word line spacers.

7. The device according to claim 5, wherein the word line capping layer pattern is an insulating layer having substantially the same etching ratio as that of the word line spacers.

8. The device according to claim 5, further comprising:
   electrode impurity regions disposed under a main surface of the semiconductor substrate and being respectively in contact with the plug patterns, wherein the electrode impurity regions overlap the word line pattern, respectively, and contacts the channel-portion hole, respectively.

9. The device according to claim 8, wherein the electrode impurity regions have the same conductivity type as that of the plug patterns.

10. The device according to claim 8, wherein the electrode impurity regions have a conductivity type different from that of the semiconductor substrate.

11. The device according to claim 1, wherein the channel-portion layer is coupled to the semiconductor substrate through a portion of sidewall of the channel-portion hole.

* * * * *